United States Patent
Gardner et al.

(10) Patent No.: US 8,733,272 B2
(45) Date of Patent: May 27, 2014

(54) ELECTRODE CONFIGURATIONS FOR PIEZOELECTRIC ACTUATORS

(75) Inventors: Deane A. Gardner, Cupertino, CA (US); Andreas Bibl, Los Altos, CA (US)

(73) Assignee: FUJIFILM Corporation, Tokyo (JP)

( * ) Notice: Subject to any disclaimer, the term of this patent is extended or adjusted under 35 U.S.C. 154(b) by 611 days.

(21) Appl. No.: 12/981,089

(22) Filed: Dec. 29, 2010

(65) Prior Publication Data
US 2012/0167823 A1    Jul. 5, 2012

(51) Int. Cl.
*B05B 9/04*    (2006.01)
*H01L 41/08*    (2006.01)

(52) U.S. Cl.
CPC .................... *H01L 41/0805* (2013.01)
USPC .......................................... 118/313; 118/695

(58) Field of Classification Search
CPC .................................................. H01L 41/0805
USPC .......................................... 118/300, 313, 695
See application file for complete search history.

(56) References Cited

U.S. PATENT DOCUMENTS 5,376,857 A * 12/1994 Takeuchi et al. ............. 310/328
6,629,756 B2 * 10/2003 Wang et al. ..................... 347/68
7,772,747 B2    8/2010 Fujii et al.
2009/0236949 A1 * 9/2009 Fujii et al. ..................... 310/367
2010/0208004 A1    8/2010 Ottosson et al.

FOREIGN PATENT DOCUMENTS

WO    2012018561    2/2012

* cited by examiner

*Primary Examiner* — Dah-Wei D Yuan
*Assistant Examiner* — Stephen Kitt
(74) *Attorney, Agent, or Firm* — Fish & Richardson P.C.

(57) ABSTRACT

Fluid ejection apparatuses and processes for making the same are disclosed. An apparatus for ejecting fluid droplets includes a substrate having a plurality of flow paths formed therein, each flow path including a respective pumping chamber and a respective nozzle, and the respective nozzle being configured to eject fluid droplets through a first surface of the substrate in response to actuation of the respective pumping chamber; and an actuation assembly including a drive electrode layer over a second surface of the substrate opposite to the first surface, a piezoelectric layer over the drive electrode layer, and a reference electrode layer over the piezoelectric layer, the drive electrode layer being patterned to define an individually controllable drive electrode over each of two or more pumping chambers in the substrate, and the reference electrode layer including a continuous reference electrode spanning the two or more pumping chambers in the substrate.

24 Claims, 8 Drawing Sheets

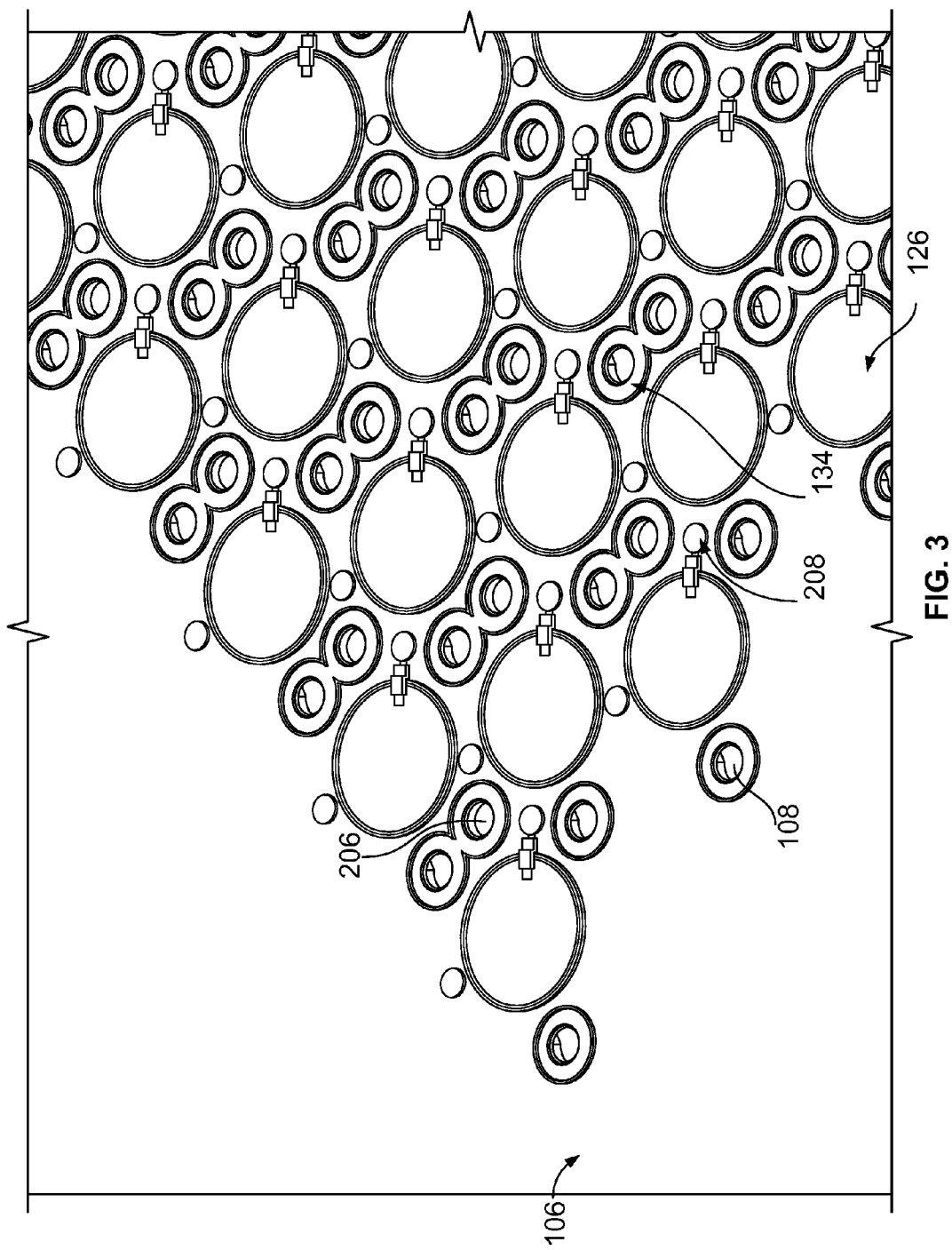

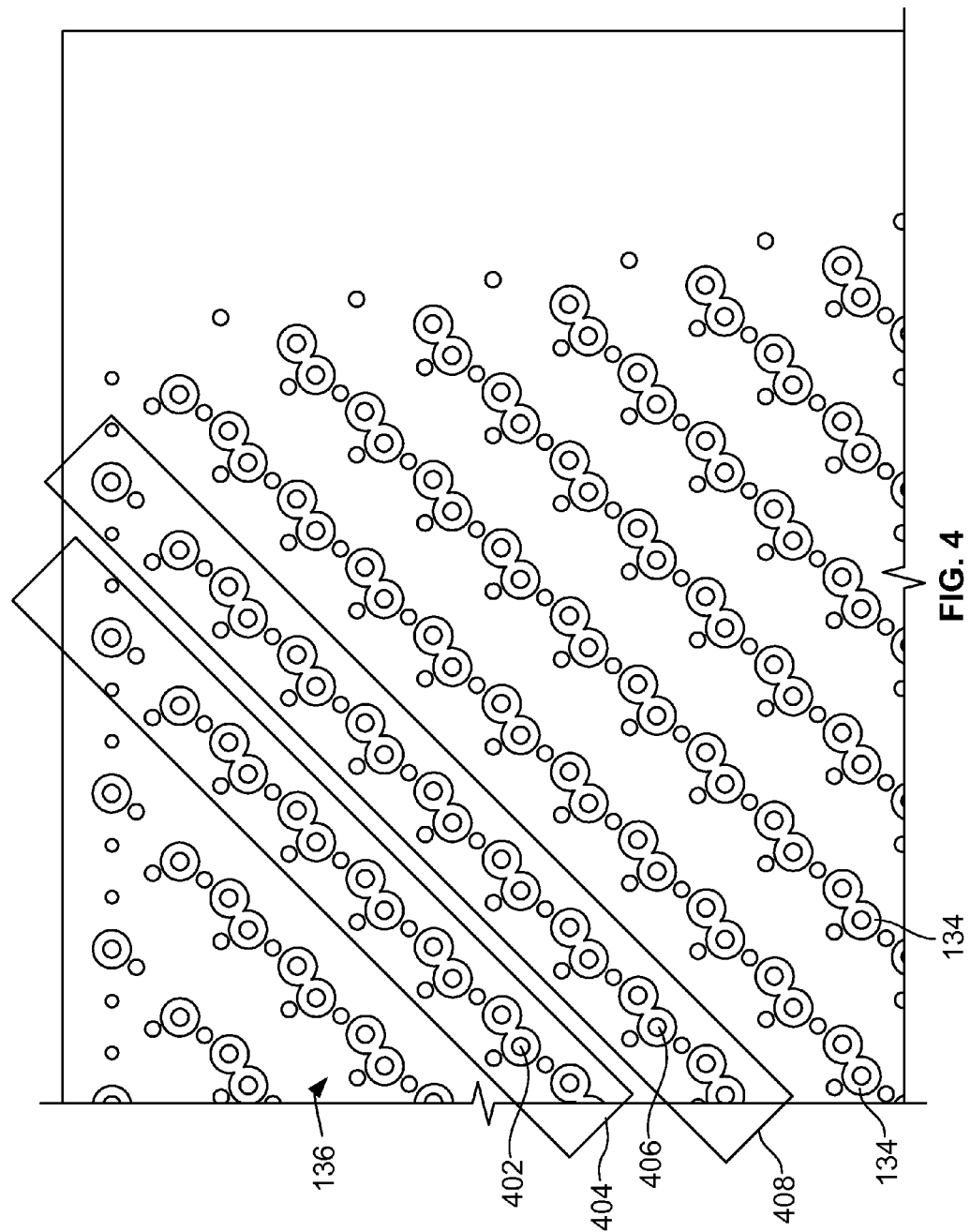

ELECTRODE CONFIGURATIONS FOR PIEZOELECTRIC ACTUATORS

TECHNICAL FIELD

This specification relates to MEMS actuators.

BACKGROUND

An example fluid ejection module typically has a line or an array of nozzles with a corresponding array of flow paths. Each flow path includes a pumping chamber controllable by an associated actuator, such as a piezoelectric actuator. The piezoelectric actuator includes a layer of piezoelectric material that changes geometry (or actuates) in response to a voltage applied across the piezoelectric layer by a pair of opposing electrodes. The pair of opposing electrodes includes a drive electrode and a reference electrode, and the voltage applied across the piezoelectric layer can be controlled by maintaining the reference electrode at a fixed reference voltage or potential while varying a driving voltage or potential on the driving electrode. The piezoelectric actuator is attached to a membrane over the pumping chamber. The actuation of the piezoelectric layer in response to the voltages applied across the piezoelectric layer causes the membrane to flex. The flexing of the membrane pressurizes fluid in the pumping chamber along the flow path and eventually ejects a fluid droplet out of the nozzle.

SUMMARY

This specification describes technologies related to MEMS actuators.

In one aspect, an apparatus for ejecting fluid droplets includes: a substrate having a plurality of flow paths formed therein, each flow path including a respective pumping chamber and a respective nozzle, and the respective nozzle being configured to eject fluid droplets through a first surface of the substrate in response to actuation of the respective pumping chamber; and an actuation assembly including a drive electrode layer over a second surface of the substrate opposite to the first surface, a piezoelectric layer over the drive electrode layer, and a reference electrode layer over the piezoelectric layer, the drive electrode layer being patterned to define an individually controllable drive electrode over each of two or more pumping chambers in the substrate, and the reference electrode layer including a continuous reference electrode spanning the two or more pumping chambers in the substrate.

In some implementations, the apparatus further includes circuitry electrically connected to each drive electrode and to the continuous reference electrode, the circuitry being configured such that during fluid droplet ejection, the continuous reference electrode being maintained at a reference voltage at or near an earth ground voltage, and each drive electrode being configured to actuate the piezoelectric layer using driving voltages whose minimum is at or above the reference voltage.

In some implementations, the apparatus further includes an integrated circuit layer, the integrated circuit layer being attached to the actuation assembly on a side of the actuation assembly opposite to the substrate, the integrated circuit layer including one or more application-specific integrated circuits (ASICs) for individually controlling the drive electrodes in the actuation assembly.

In some implementations, the integrated circuit layer includes fluid passages for transporting fluid to the flow paths in the substrate.

In some implementations, the integrated circuit layer includes one or more active circuit components and an electrical ground, the one or more active circuit component being electrically connect to the drive electrodes in the actuation assembly, and the electrical ground being electrically connected to the reference electrode in the actuation assembly.

In some implementations, the one or more active circuit components comprise positive logic transistors having a low state at or above a voltage of the electrical ground.

In some implementations, the one or more active circuit components comprise NMOS or NDMOS transistors.

In some implementations, the electrical ground in the integrated circuit layer is maintained at a reference voltage at or near an earth ground voltage, and the one or more active circuit components have minimum output voltages at or above the reference voltage.

In some implementations, the piezoelectric layer is poled in a direction pointing from the drive electrode layer to the reference electrode layer.

In some implementations, the piezoelectric layer comprises a layer of Lead Zirconate Titanate (PZT).

In some implementations, the piezoelectric layer comprises a layer of sputtered Lead Zirconate Titanate (PZT).

In some implementations, the substrate has a nozzle density sufficient to generate a resolution of at least 100 dpi.

In some implementations, the pumping chambers in the substrate form a parallelogram-shaped array, and each drive electrode has at least one pair of edges along a direction substantially parallel to an edge of the parallelogram-shaped array and spans a cross-section of a single pumping chamber in the substrate.

In some implementations, the drive electrode layer is made of a first conductor and the reference electrode is made of a second, different conductor.

In some implementations, at least one of the drive electrode layer or the reference electrode layer has a thickness of 1000 to 3000 Angstroms.

In some implementations, the piezoelectric layer is patterned to define an individual piezoelectric element within an area over each drive electrode in the drive electrode layer.

In some implementations, the continuous reference electrode includes one or more apertures.

In some implementations, the apparatus further includes an integrated circuit layer attached to the actuation assembly on a side of the actuation assembly opposite to the substrate, and each of the one or more apertures encircling a respective electrical connection between a drive electrode in the actuation assembly and the integrated circuit layer.

In some implementations, the respective electrical connection between the drive electrode and the integrated circuit layer is a vertically-oriented conductive column going through the aperture, and wherein the vertically-oriented conductive column is electrically connected to the drive electrode and is electrically insulated from the reference electrode.

In some implementations, the apparatus further includes: an integrated circuit layer attached to the actuation assembly on a side of the actuation assembly opposite to the substrate; and one or more vertically-oriented conductive columns between the integrated circuit layer and the continuous reference electrode layer.

In some implementations, at least some of the one or more conductive columns electrically connect the reference electrode and the integrated circuit layer.

In some implementations, at least some of the one or more conductive columns are electrically connected to a voltage ground in the integrated circuit layer.

In another aspect, a method for forming a fluid ejection apparatus includes the actions of: attaching an actuation assembly to a first surface of a substrate, the actuation assembly including a drive electrode layer attached to the first surface the substrate, a piezoelectric layer over the drive electrode layer, and a reference electrode layer over the piezoelectric layer, the drive electrode layer being patterned to define an individually controllable drive electrode over each of two or more pumping chambers formed or to be formed in the substrate, and the reference electrode layer including a continuous reference electrode spanning the two or more pumping chambers in the substrate; and forming a plurality of flow paths in the substrate, each flow path including a respective pumping chamber and a respective nozzle, and the respective nozzle being configured to eject fluid droplets through a second surface of the substrate in response to actuation of the respective pumping chamber.

In some implementations, the action of attaching the actuation assembly to the first surface of the substrate further includes the actions of: depositing a first conductive layer over the first surface of the substrate, the first conductive layer forming the drive electrode layer; sputtering a layer of piezoelectric material over the first conductive layer, the layer of sputtered piezoelectric material forming the piezoelectric layer; patterning the layer of sputtered piezoelectric material to form an individual piezoelectric element over each of the two or more pumping chambers formed or to be formed in the substrate; after patterning the layer of sputtered piezoelectric material, patterning the first conductive layer to form the individually controlled drive electrode over each of the two or more pumping chambers formed or to be formed in the substrate; depositing an insulating layer over the individual piezoelectric elements and the individually controlled drive electrodes formed after the patterning of the piezoelectric layer and the drive electrode layer; and depositing a second conductive layer over the insulating layer, the second conductive layer forming the reference electrode layer.

In some implementations, the method further includes the action of: attaching an integrated circuit layer to the actuation assembly on a side of the actuation assembly opposite to the substrate, the integrated circuit layer including one or more application-specific integrated circuits (ASICs) for individually controlling the drive electrodes in the actuation assembly.

In some implementations, the integrated circuit layer includes vertically-oriented fluid passages for transporting fluid to the flow paths in the substrate.

In some implementations, the integrated circuit layer includes one or more active circuit components and an electrical ground, and the method further includes the actions of: electrically connecting the one or more active circuit component to the drive electrodes in the substrate; and electrically connecting the electrical ground to the reference electrode in the substrate.

In some implementations, the action of attaching the integrated circuit layer to the actuation assembly further includes the action of: electrically connecting one or more active components of the integrated circuit layer to the drive electrodes by eutectic bonding.

In another aspect, an apparatus for ejecting fluid droplets includes: a substrate having a plurality of flow paths formed therein, each flow path including a respective pumping chamber and a respective nozzle, and the respective nozzle being configured to eject fluid droplets through a first surface of the substrate in response to actuation of the respective pumping chamber; an actuation assembly, the actuation assembly including a drive electrode layer attached to a second surface the substrate opposite to the first surface, a piezoelectric layer over the drive electrode layer, and a reference electrode layer over the piezoelectric layer, the drive electrode layer including a respective drive electrode over each pumping chamber in the substrate, and the reference electrode layer including a continuous reference electrode; and an integrated circuit layer, the integrated circuit layer being attached to the actuation assembly on a side of the actuation assembly opposite to the substrate, the integrated circuit layer including circuitry electrically connected to each drive electrode and to the continuous reference electrode, the circuitry being configured such that during fluid droplet ejection, the reference electrode is maintained a reference voltage at or near an earth ground voltage, and each drive electrode being configured to actuate the piezoelectric layer using driving voltages whose minimum is at or above the reference voltage.

In some implementations, the integrated circuit layer includes vertically-oriented fluid passages for transporting fluid to or from the flow paths in the substrate.

In some implementations, the fluid transported through the fluid passages in the integrated circuit layer is at the reference voltage of the reference electrode.

In some implementations, the continuous reference electrode, an electric ground of the integrated circuit layer, and the fluid transported through the fluid passages in the integrated circuit layer at maintained at or near the earth ground voltage.

In some implementations, the continuous reference electrode includes one or more apertures, where a respective electrical connection is made between each drive electrode in the drive electrode layer and the circuitry in the integrated circuit layer, and where each respective electrical connection is conductive column going through a respective one of the one or more apertures in the continuous reference electrode.

Particular implementations of the subject matter described in this specification can be implemented so as to realize one or more of the following advantages.

In a design for an actuation assembly that has a piezoelectric layer with an as-deposited poling direction pointing from the substrate to the piezoelectric layer, the electrode configuration is that: a first conductive layer below the piezoelectric layer and between the piezoelectric layer and the substrate serves as the drive electrode layer and includes multiple drive electrodes, while a second conductive layer above the piezoelectric layer serves as the reference electrode layer and includes a continuous reference electrode spanning multiple drive electrodes. With such an electrode configuration, positive driving voltages between each drive electrode and the reference electrode can be used to cause fluid ejection from a corresponding pumping chamber in the substrate.

By enabling the use of positive driving voltages to cause fluid ejection, the above design of the actuation assembly allows an integrated circuit layer to be attached to the side of the actuation assembly opposite to the substrate, where the integrated circuit layer includes circuitry for individually controlling a large array of drive electrodes in the drive electrode layer. In addition, fluid passages can be included in the integrated circuit layer for channeling fluid (e.g., from a fluid supply located above the integrated circuit layer) through the integrated circuit layer into the flow paths in the substrate. The body of the integrated circuit layer can be kept at an electric potential at or near the earth ground potential, thus the fluid going through the fluid passages in the integrated circuit layer need not be insulated or can have reduced insulation from the body of the integrated circuit layer to avoid electrolysis-caused erosion in the integrated circuit layer and fluid decomposition. At the same time, the body of the integrated circuit layer can be kept at a potential below the lowest potential (e.g., the minimum of the driving voltages) that the drive electrodes can have during fluid ejection operation, to isolate the active circuit components (e.g., transistors) in the integrated circuit layer. This can permit the transistors of the integrated circuit layer to be fabricated as NMOS or NDMOS devices, which can have a lower fabrication cost than PMOS devices.

In addition, if insulation were needed to isolate fluid from the integrated circuit layer, compatibility between the fluid and the insulating materials would have to be considered to avoid possible chemical interactions between the fluid and the insulating materials. In contrast, when the fluid does not need to be insulated from the body of the integrated circuit layer (e.g., as enabled by the electrode configuration described herein), a wider range of fluid can be used in the fluid ejection module because the fluid selection is no longer constrained by any insulating materials used to isolate the fluid from the integrated circuit layer. Therefore, the fluid ejection module can have a wider applicability.

In addition, the integrated circuit layer attached to the actuation assembly on the side of the reference electrode can pack a large number of integrated circuit components into a small space over the substrate of the fluid ejection module. A respective electrical connection can be made from each individual drive electrode in the drive electrode layer to a corresponding control circuit in the integrated circuit layer by a vertically-oriented conductive column going through a respective aperture in the continuous reference electrode. Thus, in this design, the need for conductive traces running laterally in a plane of the drive electrode layer from the drive electrodes to their respective external control circuits can be avoided. Consequently, a higher density of individually controllable actuators can be packed into the space over the substrate, and a higher nozzle density and print resolution can be achieved in the fluid ejection module.

In addition, in one implementation of the design, the body of the integrated circuit layer, the fluid going through the fluid passages in the integrated circuit layer, and the reference electrode can all be kept at or near the earth ground potential, while the drive electrode carries the positive driving signals to create the necessary voltage differentials across the piezoelectric layer and to cause fluid ejection. By keeping the components of the fluid ejection module other than the drive electrodes at or near the earth ground potential, the fluid ejection module can be substantially inert relative to its environment, which leads to better handling safety and improved lifetime of the fluid ejection module.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 3 is a perspective view of an example drive electrode layer of the actuation assembly.

FIG. 4 is a perspective view of a side of the integrated circuit layer facing the reference electrode layer of the actuation assembly.

Many of the layers and features are exaggerated to better show the process steps and results. Like reference numbers and designations in the various drawings indicate like elements.

DETAILED DESCRIPTION

Figure 1:
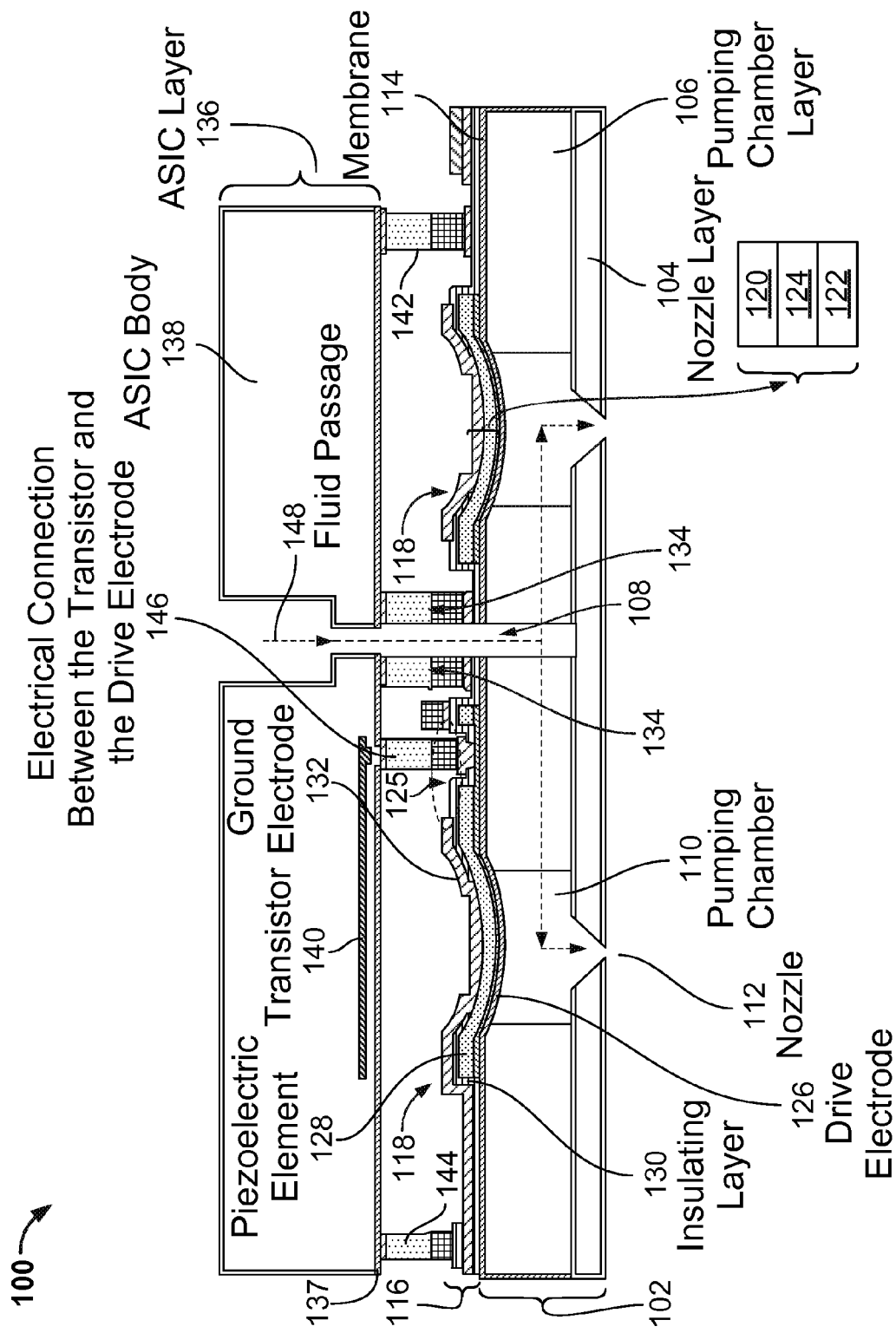
FIG. 1 is a vertical cross-section of an example fluid ejection module including an actuation assembly and an integrated circuit layer above the actuation assembly.

Fluid droplet ejection can be implemented with a fluid ejection module which includes a printhead die fabricated using semiconductor processing techniques. The printhead die includes a substrate in which a plurality of microfabricated fluid flow paths are formed, and a plurality of actuators to cause fluid to be selectively ejected from nozzles of the flow paths. Thus, each flow path with its associated actuator provides an individually controllable fluid ejector unit.

In a fluid ejection module, the plurality of actuators form an actuation assembly. The actuation assembly can be attached to the substrate on a side of the substrate opposite to the side that includes the nozzle openings. An integrated circuit layer (e.g., an ASIC layer) can be attached to the actuation assembly and used to control individual actuators in the actuation assembly. Fluid passages can be formed through the integrated circuit layer to channel fluid in and out of the flow paths in the substrate.

The fluid flowing through the fluid passages in the integrated circuit layer is typically in contact with elements (e.g., heater, fluid reservoir, etc.) of the fluid ejection module that are kept at the earth ground potential. In order to avoid electrolysis-caused erosion in the integrated circuit layer and fluid decomposition, the body of the integrated circuit layer should be kept at or near the earth ground potential, such that no or minimal electrolysis-causing current would be induced between the fluid and the inner walls of the fluid passages in the integrated circuit layer by a voltage difference between the fluid and the inner walls of the fluid passages.

For example, for a given fluid flowing through the fluid passages in the integrated layer, a threshold voltage difference between the fluid and the body of the integrated circuit layer is needed to cause electrolysis in the fluid flowing through the fluid channels. The threshold voltage difference is dependent on the composition of the fluid and the minimum energies (e.g., measured by the Gibb's free energy) required to oxidize or to reduce the substances in the fluid and the body of the inner walls of the fluid passages in contact with the fluid. Therefore, to avoid electrolysis-caused erosion or fluid decomposition, the body of the integrated circuit layer (and hence, the inner walls of the fluid passages in the integrated circuit layer) should be kept within a threshold voltage range around and include the earth ground potential. In various implementations, depending on the composition of the fluid, the absolute size of the threshold voltage range can be 0.1 volt, 0.6 volt, 2 volt, 4 volt, or 6 volt, for example. In various implementations, the earth ground potential may be located at the center of the threshold voltage range, at an upper end of the threshold voltage range, at a lower end of the voltage range, or any locations in the threshold voltage range, depending (at least in part) on the composition of the fluid and/or the body of the integrated circuit layer.

If the electrical potential of the body of the integrated circuit layer cannot be kept at or near earth ground potential (e.g., within the threshold voltage range), the fluid going through the fluid passages in the integrated circuit layer may need to be insulated from the body of the integrated circuit layer, which can add manufacturing cost and complexity to the fluid ejection module.

The integrated circuit layer includes active circuit components (e.g., NMOS transistors) that are connected to the drive electrodes in the actuation assembly and provides the driving voltage signals to the drive electrodes. In order to isolate the active circuit components in the integrated circuit layer, the body of the integrated circuit layer should be kept at an electric potential at or below the lowest potential that the drive electrode can have when the drive electrode is in operation (or in other words, the minimum of the driving voltages). This poses an upper bound on the electric potential of the body of the integrated circuit layer. If the body of the integrated circuit layer cannot be kept below this upper bound, special transistor components and designs may be needed to form the control circuits in the integrated circuit layer, which can add design complexity and manufacturing cost to the fluid ejection module.

Given the two constraints set forth above on the electrical potential of the body of the integrated circuit layer, it is advantageous to use a positive driving signal whose minimum is at or above the upper bound of the threshold voltage range for avoiding electrolysis-caused erosion and fluid decomposition, because that helps to eliminate the need to insulate the fluid passages from the fluid and the need to use special transistors and designs to isolate the active circuit elements in the integrated circuit layer. At the same time, it is disadvantageous to use a negative driving signal whose minimum is below the lower bound of the threshold voltage range for avoiding electrolysis-caused erosion and fluid decomposition, because that would limit the choices of the fluid that can be used in the fluid ejection system, require insulation of fluid passages, require use of more expensive transistors or special designs in the integrated circuit layer, all of which can add cost or limit the applications of the fluid ejection system.

In a piezoelectric fluid ejection system, a piezoelectric membrane disposed between a pair of opposing electrodes can flex in response to a driving voltage applied between the pair of opposing electrodes. When the driving voltage causes an electric field pointing in the same direction as the poling direction of the piezoelectric membrane, the piezoelectric membrane expands. When the driving voltage causes an electric field pointing in the opposite direction from the poling direction of the piezoelectric membrane, the piezoelectric membrane contracts. Although it is possible to have a fluid ejection cycle in which the piezoelectric membrane goes into both an expanded state and a contracted state, such a fluid ejection cycle would require a driving signal that has both a positive portion and a negative portion. The driving signal that has both a positive portion and a negative portion can be less desirable in some cases because the portion of the driving signal that causes the piezoelectric membrane to go into the contracted state can tend to de-pole the piezoelectric membrane over time, leading to shorter lifetime of the piezoelectric membrane. Therefore, it can be advantageous to use a driving signal that is either entirely positive or entirely negative during a fluid ejection cycle, where the driving signal only causes electric fields pointing in the same direction as the poling direction of the piezoelectric membrane, and where the electric fields cause the piezoelectric membrane to flex between a maximum expanded state and a minimum expanded state (or the resting state).

In some fluid ejection systems, when bulk piezoelectric materials are used between the drive electrode layer and the reference electrode layer of the actuation assembly, the piezoelectric layer formed from the bulk piezoelectric material can be oriented such that its poling direction points in a direction going from the piezoelectric layer to the substrate (e.g., pointing downwards toward the substrate). Based on such orientation of the piezoelectric layer, a conductive layer below the piezoelectric layer and between the piezoelectric layer and the substrate can serve as the reference electrode layer, while a conductive layer above the piezoelectric layer can serve as the drive electrode layer. With such a configuration, positive driving signals can be used to cause fluid ejection in these fluid ejection systems, and the above mentioned constraints on the electric potential of the integrated circuit layer can be satisfied.

In contrast to a piezoelectric layer formed from bulk piezoelectric materials, a piezoelectric layer formed by depositing (e.g., by sputtering) particles of piezoelectric materials on a substrate is not easily reoriented after its formation on the substrate. The piezoelectric layer deposited on the substrate has an as-deposited poling direction pointing in a direction going from the substrate to the piezoelectric layer (e.g., pointing up away from the substrate). Based on such orientation of the piezoelectric layer, if the conductive layer below the piezoelectric layer and between the piezoelectric layer and the substrate were to serve as the reference electrode layer, while the conductive layer above the piezoelectric layer were to serve as the drive electrode layer, negative driving voltages would have to be used to cause an electric field pointing in the same direction as the poling direction of the piezoelectric layer. As set forth above with respect to the constraints on the electric potential of the body of the integrated circuit layer, the use of negative driving voltages would require special designs to be made for the integrated circuit layer, adding complexity and manufacturing cost to the fluid ejection module. Thus, such electrode configuration (i.e., reference electrode is below the piezoelectric layer and closer to the substrate, and the drive electrode is above the piezoelectric layer and farther from the substrate) can be less desirable in some implementations.

In an alternative design for the actuation assembly that includes a piezoelectric layer having an as-deposited poling direction pointing from the substrate to the piezoelectric layer (e.g., pointing upward away from the substrate), the conductive layer below the piezoelectric layer and between the piezoelectric layer and the substrate serves as the drive electrode layer, while the conductive layer above the piezoelectric layer serves as the reference electrode layer. With such a configuration, positive driving signals can be used to cause electric fields pointing in the same direction as the poling direction of the piezoelectric layer, and to cause fluid ejection in the fluid ejection module.

Consequently, in the alternative design, the body of the integrated circuit layer can be maintained at a potential at or near the earth ground potential, the fluid going through the fluid passages in the integrated circuit layer need not be insulated from the body of the integrated circuit layer to avoid electrolysis-caused erosion in the integrated circuit layer and fluid decomposition. At the same time, the body of the integrated circuit layer can be kept at a potential below the lowest potential that the drive electrode can have during operation (e.g., the minimum of the driving voltages) to isolate the circuit components (e.g., transistors) in the integrated circuit layer.

In one implementation of this alternative design, the body of the integrated circuit layer, the fluid going through the fluid passages in the integrated circuit layer, and the reference electrode can all be kept at the earth ground potential (e.g., 0 volts), while the drive electrode carries the positive driving signals (e.g., entirely positive driving voltages) to create the necessary voltage differentials across the piezoelectric layer and to cause fluid ejection.

FIG. 1 is a schematic cross-sectional view of a portion of an exemplary fluid ejection module 100.

The fluid ejection module 100 includes a substrate 102 in which a plurality of passages are formed. The substrate 102 can be a semiconductor (e.g., silicon) body including multiple layers, such as a nozzle layer 104 and a pumping chamber layer 106. Each of the nozzle layer 104 and the pumping chamber layer 106 may be a single layer (e.g., a silicon layer, a polymer layer, a polysilicon layer, etc.) or include multiple layers of different materials. Each passage through the substrate 102 defines a flow path for fluid (e.g. ink) to be ejected or re-circulated.

Each flow path passage includes a fluid inlet 108, a pumping chamber 110, and a fluid ejection nozzle 112. Fluid enters the pumping chamber 110 through the fluid inlet 108, and can be ejected through the fluid ejection nozzle 112 (as shown by the dashed lines leading from the fluid inlet 108 to the pumping chambers 110). Optionally, fluid not ejected out of the fluid ejection nozzle 112 can exit the pumping chamber 110 through a fluid outlet (not shown in FIG. 1). The fluid inlet 108 can be fluidically connected to a fluid supply channel (not shown), and the fluid outlet can be fluidically connected to a fluid return channel (not shown). Each fluid supply channel and each fluid return channel can be shared by multiple flow paths in the substrate 102.

As shown in FIG. 1, the substrate 102 includes a pumping chamber layer 106 attached to the top side of the nozzle layer 104. Each pumping chamber 110 is a cavity formed in the pumping chamber layer 106. The fluid ejection nozzle 112 is an aperture formed through the nozzle layer 104. The fluid ejection nozzle 112 is fluidically connected to the pumping chamber cavity on one side, and has an opening through the bottom surface of nozzle layer 104 on the opposite side. The openings of the nozzles 112 form an array of apertures on the exposed surface of the nozzle layer 104 (or in other words, the nozzle face of the substrate 102).

The substrate 102 also optionally includes a membrane layer 114 attached to the top side of the pumping chamber layer 106. The membrane layer 114 can be an oxide layer that seals the pumping chambers 110 from above. The portion of the membrane layer 114 over each pumping chamber cavity is flexible and capable of flexing under the actuation of a corresponding piezoelectric actuator. The flexing of the membrane expands and contracts the pumping chamber cavity and pumps the fluid along the flow path, and eventually ejects the fluid out through the nozzle opening.

Above the membrane layer 114 is an actuation assembly 116. The actuation assembly 116 includes a plurality of piezoelectric actuator structures 118 disposed on the substrate 102, with each actuator structure 118 positioned over an associated pumping chamber 110. The piezoelectric actuator structures 118 can be supported on the top side of the membrane layer 114. If the membrane layer 114 does not exist in a particular implementation, the actuation assembly 116 can be disposed directly on the top side of the pumping chamber layer 106, and the bottom surface of the piezoelectric actuator structures 118 can seal the pumping chambers 110 from above.

The actuation assembly 116 includes a first conductive layer (e.g., a reference electrode layer 120), a second conductive layer (e.g., a drive electrode layer 122), and a piezoelectric layer 124 disposed between the first and the second conductive layers. The second conductive layer (e.g., a drive electrode layer 122) is on the side of the piezoelectric layer 124 closer to the pumping chamber 110; the drive electrode layer 122 can be formed directly on the membrane 114. The first conductive layer (e.g., a reference electrode layer 120) is on the side of the piezoelectric layer 124 farther from the pumping chamber 110; the reference electrode layer 120 can be formed directly on the piezoelectric layer 124.

In some implementations, the reference electrode layer 120 and the drive electrode layer 122 can be of the same conductive material. In some implementations, the reference electrode layer 120 and the drive electrode layer 122 can be made of different conductive materials. The reference electrode layer 120 and the drive electrode layer 122 can each include one or more layers of different conductive materials, such as to improve conductivity, chemical compatibility, and/or adhesion to the substrate 102 and/or piezoelectric layer 124. The conductive materials for the reference electrode layer 120 and the drive electrode layer 122 can include one or more of various metals (e.g., Au, Pt, Ni, Ir, etc.), alloys (e.g., Au/Sn, Ir/TiW, Au/TiW, AuNi, etc.), metal oxides (e.g., $IrO_2$, $NiO_2$, $PtO_2$, etc.), or combinations thereof, for example. The reference electrode layer 120 and the drive electrode layer 122 can each have a thickness of a few thousand angstroms, such as 1000-3000 angstroms. The thickness of the drive electrode layer 122 and the reference electrode layer 120 can be selected based on the current that is needed to drive the piezoelectric actuators 118 of the fluid ejection module 100, and the resistivity of the conductive material(s) used for the drive electrode layer 122 and the reference electrode layer 120, respectively.

The piezoelectric layer 124 can be formed over the second conductive layer by gradually depositing (e.g., sputtering) particles of piezoelectric materials (e.g., Lead Zirconate Titanate (PZT)) over the second conductive layer. Within the actuation assembly 116, the piezoelectric electric layer 124 has an as-deposited polarization (or poling direction) pointing in a direction from the drive electrode layer 122 to the reference electrode layer 120, where the drive electrode layer 122 is disposed closer to the substrate 102 than the reference electrode layer 120.

Some environments that are used for sputtering the piezoelectric material include a direct current (DC) bias during sputtering. The DC field causes the piezoelectric material to be polarized (or "poled") in the direction of the DC field. Without being limited to any particular theory, the as-deposited poling direction of the sputtered piezoelectric layer points away from the underlying substrate surface along the grain structure of the sputtered piezoelectric layer. Therefore, the as-deposited poling direction is substantially locally perpendicular to the surface of the sputtered piezoelectric layer. Such as-deposited poling direction of the sputtered piezoelectric layer can reduce the stress in the piezoelectric layer during actuation, which can result in extended useful life of the piezoelectric actuator.

The drive electrode layer 122 is patterned to form a respective drive electrode 126 above each pumping chamber 110 in the substrate 102. The piezoelectric layer 124 can be patterned to form a respective piezoelectric element 128 above each drive electrode 126 in the drive electrode layer 122. The respective drive electrode 126 above each pumping chamber 110 can be separated from the drive electrodes 126 above other pumping chambers 110, and spans only a single pumping chamber. Similarly, the respective piezoelectric element 128 above each drive electrode 126 can be separated from the piezoelectric elements 128 above other drive electrodes 126, and spans only a single drive electrode 126. However, in some implementations, the piezoelectric elements 128 above multiple drive electrodes 126 can form a continuous sheet spanning the multiple drive electrodes. The reference electrode layer 120 can be a continuous conductive layer that spans the drive electrodes 126 over multiple pumping chambers 110, and forms a common reference electrode 132 for multiple piezoelectric actuators 118 in the actuation assembly 116.

An insulating layer 130 can be disposed over the patterned piezoelectric layer 124 and drive electrode layer 122 to insulate individual drive electrodes 126 from one another, and optionally, to insulate individual piezoelectric elements from one another. Thus, each individual drive electrode 126 can be independently drivable. The insulating layer 130 further insulates the reference electrode layer 120 from the piezoelectric elements 128 and the drive electrodes 126, except in the regions over the pumping chamber cavities. In the regions over the pumping chamber cavities, the reference electrode layer 120 is in direct contact with the piezoelectric elements 128, and the piezoelectric elements 128 separate the reference electrode layer 120 from coming into contact with the drive electrodes 126 over the pumping chamber cavities.

The reference electrode layer 120 or the common reference electrode 132 shown in FIG. 1 includes a first plurality of apertures that are connected to the fluid inlets 108 and fluid outlets (not shown in FIG. 1) in the substrate 102, respectively. The apertures are located over respective areas in the piezoelectric layer 124 and the drive electrode layer 122 where the piezoelectric materials and conductive materials of the layers have been removed. The same apertures can be formed in the insulating layer 130 directly below the reference electrode layer 120, if needed. Fluid seals 134 can be formed around the apertures in the space above the reference electrode layer 120. The fluid seals 134 prevent fluid passing through the apertures into and out of the substrate 102 from escaping into regions near the piezoelectric actuators 118 and coming in contact with the elements of the piezoelectric actuators 118. In some implementations, the fluid seals 134 are metal seals formed using a eutectic bonding process, where the metal(s) used to form the seals are resistant to the attack of the fluid passing through the apertures. The first plurality of apertures in the fluid reference electrode layer 120 can form a first aperture array, and are distributed in proximity to respective pumping chambers in the substrate 102.

As shown in FIG. 1, the drive electrode layer 122 of the actuation assembly 116 is disposed on the side of the piezoelectric layer 124 that is closer to the substrate 102, while the reference electrode layer 120 is disposed on the side of the piezoelectric layer 124 that is farther away from the substrate 102. Therefore, the common reference electrode 132 also includes a second plurality of apertures (e.g., in the areas 125) through each of which an electrical connection to a respective drive electrode 126 below the common reference electrode 132 can be made. The boundaries of the apertures are insulated from the electric connections (e.g., the electric connections below the conductive columns 146) and the drive electrodes 126 by the insulating layer 130. The second plurality of apertures can form a second aperture array, and are distributed in proximity to respective pumping chambers in the substrate 102.

The piezoelectric element 128 of the piezoelectric actuator structure 118 expands or contracts in response to a voltage applied across the piezoelectric element 128 between the respective drive electrode 126 of the piezoelectric actuator structure 118 and the common reference electrode 132. The expansion and contraction of the piezoelectric element 128 causes the membrane over the pumping chamber 110 to change geometry, and in turn causes the pumping chamber 110 to expand or contract. The expansion of the pumping chamber 110 draws the fluid along the flow path into the pumping chamber 110, and the contraction of the pumping chamber 110 forces a fluid droplet through and out of the fluid ejection nozzle 112.

In some implementations, each of the drive electrode 126, the piezoelectric element 128, and the reference electrode 132 of an actuator structure 118 can be substantially planar in the region over the pumping chamber 110. In some implementations, each of the drive electrode 126, the piezoelectric element 128, and the reference electrode 132 of an actuator structure 118 can be convex (e.g., curved away from the substrate 102) or concave (e.g., curved towards the substrate 102) in the region over the pumping chamber 110.

Each pumping chamber 110 with its associated actuator structure 118 provides an individually controllable fluid ejection unit. The drive electrode 126 and the reference electrode 132 for each actuator structure 118 can be electrically coupled to a controller which supplies the voltage differential across the piezoelectric element 128 of the actuator 118 at appropriate times and for appropriate durations in a fluid ejection cycle. In the actuator structure 118, the poling direction of the piezoelectric element 128 points from the drive electrode 126 to the reference electrode 132. Consequently, when a positive voltage is applied between the drive electrode 126 and the reference electrode 132 (in other words, when the electric potential of the drive electrode 126 is raised above the electric potential of the reference electrode 132), an electric field that is parallel to the poling direction can be created in the piezoelectric element 128, causing the piezoelectric element 128 to actuate in a manner that contracts the pumping chamber 110. The contraction of the pumping chamber can cause fluid to be ejected from the pumping chamber. In some implementations, the drive electrode 126 can have a resting potential above the electric potential of the reference electrode 132, and during each fluid ejection cycle, the driving signal can include an initial portion below the resting potential and a final portion above the resting potential, such that the pumping chamber 110 first expands to draw in fluid and then contracts to expel the fluid out of the nozzle 112. During the entire fluid ejection cycle, the electric potential of the drive electrode 126 can be kept above the electric potential of the reference electrode 132, such that the entire drive signal is a positive voltage signal.

As shown in FIG. 1, the drive signal for each piezoelectric actuator 118 can be individually controlled by one or more controllers. The controllers can be implemented at least in part in an integrated circuit layer 136, such as an application-specific integrated circuit (ASIC) layer, disposed above the actuator assembly 116. The integrated circuit layer 136 can include a semiconductor body 138 and a plurality of active circuit elements, such as transistors 140 (e.g., NMOS transistors or NDMOS transistors). The active circuit elements of the integrated circuit layer 136 provide the driving signals to the drive electrodes 126 in the drive electrode layer 122. One advantage of using an integrated circuit layer 136 in the fluid ejection module 100 is that the integrated circuit layer 136 (e.g., an ASIC layer) can use a relative small number of inputs to provide a large number of output signals. A typical integrated circuit layer can have over 2000 outputs for about 200 inputs. By using the integrated circuit layer 136 that is of a similar lateral dimension as the substrate 102 (e.g., the printhead die), a high resolution (e.g., a resolution of 600 dpi or 1200 dpi, or at least 100 dpi) fluid ejection module 100 can be made very compact.

As shown in FIG. 1, the integrated circuit layer 136 can be supported above the actuation assembly 116 by a plurality of spacer bumps 142 to allow room for the flexing of the piezoelectric actuator structure 118. The active circuit elements (e.g., transistors 140) inside the integrated circuit layer 136 (e.g., the ASIC layer) can be electrically connected to the drive electrodes 126, while an electrical ground (e.g., a conductive bottom surface layer 137 of the semiconductor body 138 of the ASIC layer) in the integrated circuit layer 136 can be electrically connected to the common reference electrode 132. The electrical connections between the common reference electrode 132 and the electrical ground of the integrated circuit layer 136 can be a plurality of vertically-oriented conductive columns 144 formed between the common reference electrode 132 and the semiconductor body of the integrated circuit layer 136, for example. Similarly, the electrical connection between each drive electrode 126 and its corresponding active circuit elements (e.g., transistors 140) in the integrated circuit layer 136 can be a vertically-oriented conductive column 146 formed between the drive electrode 126 and the corresponding active circuit elements (e.g., transistors 140) in the integrated circuit layer 136, for example. The vertically-oriented conductive column 146 formed between each drive electrode 126 and corresponding active circuit elements (e.g., transistors 140) in the integrated circuit layer 136 can go through a respective aperture in the continuous common reference electrode 132 and be insulated from the continuous common reference electrode 132. In some implementations, one or more of the conductive columns 144 and 146 can also serve as spacer bumps to support the integrated circuit layer 136 above the actuation assembly 116.

As shown in FIG. 1, the integrated circuit layer 136 includes a plurality of vertically oriented fluid passages 148. Each fluid passage 148 in the integrated circuit layer 136 is fluidically connected to a corresponding fluid inlet 108 or fluid outlet (not shown in FIG. 1) of a flow path in the substrate 102. Fluid can enter a fluid passage 148 from a fluid supply (not shown) positioned above the integrated circuit layer 136, pass through an opening of a respective fluid seal 134, and enter a respective fluid inlet 108. The fluid then flows through a respective flow path in the substrate 102, and is either ejected from a respective nozzle 112 of the flow path or re-circulated to a respective fluid outlet (not shown) of the flow path. The re-circulated fluid can exit the fluid outlet, pass through an opening of a respective fluid seal (not shown in FIG. 1) into another fluid passage (not shown in FIG. 1) in the integrated circuit layer 136, and enter a fluid return (not shown in FIG. 1) positioned above the integrated circuit layer 136. The plurality of vertically-oriented fluid passages 148 in the integrated circuit layer 136 form an array of fluid passages, each of which is positioned at a location in the integrated circuit layer 136 in proximity to a respective pumping chamber 110 in the substrate 102.

In some implementations, the fluid going through the integrated circuit layer 136 may be in contact with other components (e.g., heater, chiller, or fluid reservoir) of the fluid ejection system that are kept at the earth ground potential. In order to avoid electrolysis-caused erosion to the body (e.g., the side walls of the fluid passages 148) of the integrated circuit layer 136 and fluid decomposition, the body of the integrated circuit layer 136 should be maintained at an electric potential at or near the earth ground potential (e.g., within +/−0.1 volts from the earth ground potential, within +/−0.5 volts from the earth ground potential, or within +/−1 volt from the earth ground potential).

In addition, in order to isolate the active circuit elements in the integrated circuit layer 136 which includes transistors 140, the body 138 of the integrated circuit layer 136 should be kept at an electric potential below the minimum electric potential that the active circuit components (e.g., NMOS transistors) and the drive electrodes 126 can have during fluid ejection operation. In the electrode configuration shown in the example ejection module 100, the drive electrode 126 is below the reference electrode 132, and the poling direction of the piezoelectric layer 124 points in a direction from the drive electrode 126 to the reference electrode 132. In this configuration, purely positive driving signals can be used to cause fluid ejection from the pumping chamber 110. Therefore, the body 138 of the integrated circuit layer 136 (or in other words, the electrical ground of the integrated circuit layer 136) can be kept at an electric potential at or below the minimum potential that the drive electrode 126 can have during a fluid ejection cycle, for example, at the earth ground potential.

Various advantages of keeping the body of the integrated circuit layer 136 at the earth ground potential have been set forth in the summary section and other parts of this specification.

Figure 2:
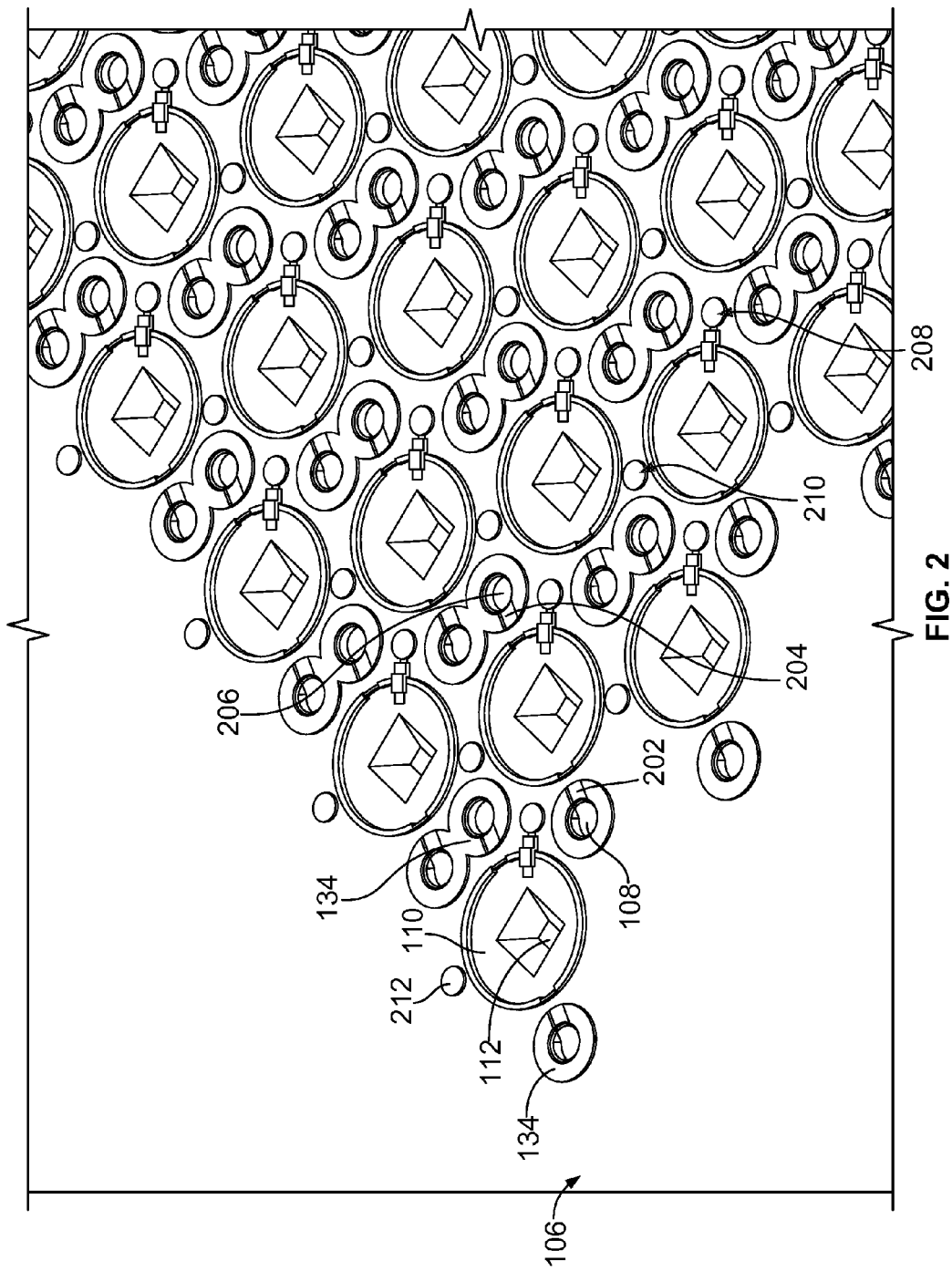
FIG. 2 is a perspective view of an example substrate of the fluid ejection module.

FIG. 2 is a perspective view of an example substrate 102 of the fluid ejection module 100. The substrate 102 includes a pumping chamber layer 106 and a nozzle layer below the pumping chamber layer 106. As shown in FIG. 2, the pumping chamber layer 106 includes a plurality of pumping chamber cavities 110. Each pumping chamber cavity 110 is situated over a corresponding nozzle 112 in the nozzle layer. Each pumping chamber cavity 110 is further connected to a respective inlet feed 202 that leads to a respective neighboring nozzle inlet 108, and a respective outlet feed 204 that leads to a respective neighboring nozzle outlet 206. Also, as shown in FIG. 2, the nozzles 112 form a nozzle array (e.g., a parallelogram-shaped nozzle array with parallel columns of nozzles) in the nozzle face of the substrate 102. Each fluid inlet 108 in the pumping chamber layer 106 is positioned in proximity to a corresponding pumping chamber 110. Similarly, each fluid outlet 206 in the pumping chamber layer 106 is also positioned in proximity to a corresponding pumping chamber 110.

Also as shown in FIG. 2, positions of the respective fluid seals 134 around the fluid inlets 108 and the respective fluid seals around the fluid outlets 206 are indicated around the fluid inlets 108 and the fluid outlets 206, respectively; positions of the respective electrical connections 208 to the drive electrodes are indicated in proximity to respective pumping chamber cavities 110; and positions of respective electrical connections 210 to the reference electrode, and positions of the spacer bumps 212 are also indicated throughout on the top surface of the pumping chamber layer 106. In some implementations, one or more electrical connections 210 to the reference electrode can also serve as the spacer bumps 212, and vice versa.

FIG. 3 is a perspective view of an example drive electrode layer 122 of the actuation assembly 116. As shown in FIG. 3, a respective drive electrode 126 is positioned over each pumping chamber 110. Each of the drive electrodes 126 can be a solid conductive leaf of a selected shape, such as an oval shape, an elliptical shape, or a polygonal shape, etc. In some implementations, the nozzles in the substrate 102 form parallel nozzle columns, and the parallel nozzle columns can form a parallelogram-shaped nozzle array. Each of the drive electrodes 126 can be a polygonal shape that has at least a pair of edges along the same direction as that of an edge of the parallelogram-shaped nozzle array on the nozzle face of the substrate 102, such that the nozzles (and the fluid ejection units) can be packed more closely on the substrate 102, leading to higher printing resolution and more a compact fluid ejection module. FIG. 3 also shows the fluid seals 134 around the fluid inlets 108 and the fluid outlets 206 deposited over the top surface of the pumping chamber layer 106.

FIG. 4 is a perspective view of a side of the integrated circuit layer 136 facing the reference electrode layer 120. A plurality of fluid passages for supplying fluid to the fluid inlets 108 and a plurality of fluid passages for collecting un-ejected fluid from the fluid outlets 206 are formed through the integrated circuit layer 136 to channel fluid from the fluid supply channels in a fluid distribution layer (not shown) to the fluid inlets 108 of the flow paths in the substrate 102, and to channel fluid from the fluid outlets 206 to the fluid return channels in the fluid distribution layer.

In some implementations, the fluid inlets 108 are distributed along a first plurality of parallel columns in the top surface of the pumping chamber layer, while fluid outlets 206 are distributed along a second plurality of parallel columns in the pumping chamber layer. Therefore, the openings 402 of the fluid passages leading from the fluid supply channels are also distributed along a first plurality of parallel columns 404 that correspond to the first plurality of parallel columns in the top surface of the pumping chamber layer. Similarly, the openings 406 of the fluid passages leading to the fluid return channels are also distributed along a second plurality of parallel columns 408 that correspond to the second plurality of parallel columns in the top surface of the pumping chamber layer.

Also shown in FIG. 4, the positions of the fluid seals, electrical connections to the drive electrodes, and electrical connections to the reference electrodes, the spacer bumps are also indicated on the bottom surface of the integrated circuit layer 136.

FIGS. 5A-5J illustrate an example process for forming a fluid ejection module including an actuation assembly that has its drive electrode layer located closer to the substrate than the reference electrode layer. For illustrative purposes, the process is shown in FIGS. 5A-5J with respect to only a single fluid ejection unit of the fluid ejection module, in actual manufacturing, many fluid ejection units can be formed on the same wafer (or a portion thereof) in this process.

Figure 5A:
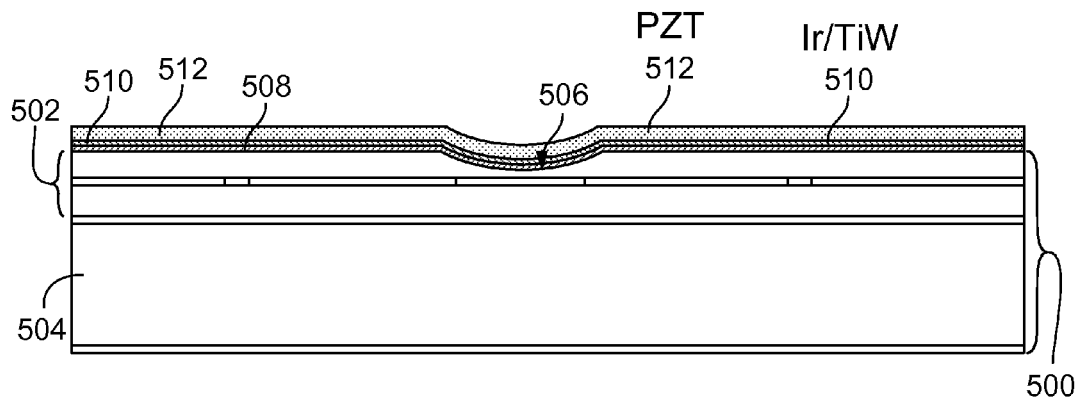
FIGS. 5A-5J illustrate an example process for making the example fluid ejection module shown in FIG. 1.

As shown in FIG. 5A, an example substrate 500 can be prepared. A substrate can be an unprocessed single semiconductor body in which flow paths will be subsequently formed, or a product of multiple prior processing steps that have defined locations (or portions) of the pumping chambers on either the surface of the substrate or within the substrate. As shown in FIG. 5A, the example substrate 500 has multiple layers, including a pumping chamber layer 502 on one side (e.g., the top side) and a handle layer 504 on an opposite side (e.g., the bottom side). On the exposed top surface of the pumping chamber layer 502, respective locations of the pumping chambers have been defined. In this example, the actuators in the actuation assembly have curved surface structures (e.g., concave or convex structures), and curved surface areas 506 (e.g., dents or domes) have been defined on the top surface of the pumping chamber layer 502 above the locations of the pumping chambers (either already formed or to be formed subsequently). In this example, previous processing steps have been performed to produce the substrate 502, and portions of the pumping chambers and the fluid inlets and outlets associated therewith have been formed in the pumping chamber layer 502. In some implementations, if actuators that have planar surface structures are to be used, the exposed top surface of the pumping chamber layer 502 can be planar, and without the dents 506 currently shown.

Optionally, a layer of thermal oxide (e.g., 0.25 microns thick) can be formed on the exposed top surface of the pumping chamber layer 502, the oxide layer 508 can serve as the etch stop used when pumping chambers are subsequently formed in the pumping chamber layer 502 by etching the pumping chamber layer 502 from the bottom side going upwards. During the etching process, the features defining the locations of the pumping chambers and the fluid inlets and fluid outlets can serve as the masks for the etching process.

After the pumping chambers are subsequently formed, the remaining oxide layer 508 can also serve as the pumping chamber membrane that keep the actuator structure formed on top from coming in to direct contact with the fluid inside the pumping chambers.

A first layer of conductive material is then deposited over the substrate 502 (e.g., on the oxide layer 508). The first layer of conductive material will be used as the drive electrode layer 510 to define the individual drive electrodes for the actuation assembly. The conductive material used for the drive electrodes can be a metal, alloy, conductive metal oxide, or a combination thereof, such as Ir, Ir/TiW, $IrO_2$, Pt, Ni, and so on.

Considerations for choosing the materials of the drive electrode layer 510 include the adhesion properties of the material relative to the substrate 502 (or any interface layers that is already deposited on the substrate 502), the conductivity of the materials, and the impendence of the materials as drive electrodes, the stability and durability of the materials, and the chemical compatibility with the piezoelectric materials that will be deposited over the drive electrode layer 510, and so on. Various suitable methods of depositing a conductive layer may be used, such as sputtering, chemical vapor deposition, physical vapor deposition, atomic layer deposition, plasma-enhanced chemical vapor deposition, and so on. The thickness of the first conductive layer can be a few thousands of angstroms (e.g., 1000-3000 angstroms).

After the first layer of conductive materials (i.e., the drive electrode layer 510) is deposited, a layer of piezoelectric materials can be deposited on the first layer of conductive materials. The layer of piezoelectric materials can be used as the piezoelectric layer 512 of the actuation assembly. Because piezoelectric materials sometimes do not develop well over small pieces of metals or conductive materials, the drive electrode layer 510 is not patterned to define the individual drive electrodes before the piezoelectric layer 512 is deposited.

Suitable methods for depositing the piezoelectric material over drive electrode layer 510 include, for example, sputtering, chemical vapor deposition, physical vapor deposition, atomic layer deposition, plasma-enhanced chemical vapor deposition, and so on. Types of sputter deposition can include magnetron sputter deposition (e.g., RF sputtering), ion beam sputtering, reactive sputtering, ion assisted deposition, high target utilization sputtering, and high power impulse magnetron sputtering. The thickness of the piezoelectric layer is selected such that the piezoelectric element is sufficiently flexible to flex under the driving voltages, and yet still enough to push fluid along the flow paths and out of the fluid ejection nozzles.

FIG. 5A shows the product formed after the drive electrode layer 510 and the piezoelectric layer 512 have been deposited over the substrate 502 (e.g., over the oxide layer 508 on top of the substrate 502). After the drive electrode layer 510 and the piezoelectric layer 512 have been deposited over the substrate 502, the piezoelectric layer 512 is patterned to define an individual piezoelectric element 514 over the location of each pumping chamber in the substrate 502. The individual piezoelectric element 514 can have a shape and size that resembles the lateral cross-section (e.g., an oval having a radius of 150 microns) of the pumping chamber, or extends slightly beyond (e.g., by 2-5 microns, or 5-15 microns) the lateral cross-section of the pumping chamber. The small extensions can help reduce operation stress in the piezoelectric element and extend lifetime of the actuator structure.

After the piezoelectric layer 512 has been patterned, portions of the drive electrode layer 510 become re-exposed in areas where the piezoelectric materials have been removed. Then, the exposed portions of the drive electrode layer 510 can be patterned (e.g., etched) to define individual drive electrodes 516. When patterning the drive electrode layer 510, the respective electrical connection pads 518 leading from the electrical connection bumps (to be formed) to the drive electrodes can be defined in the drive electrode layer 510 as well.

Each drive electrode 516 can have a shape and size that resembles the lateral cross-section of the pumping chamber below the drive electrode 516, or extends slightly beyond the lateral cross-section of the pumping chamber. In some implementations, the shape of the drive electrode 516 does not have to resemble that of the lateral cross-section of the pumping chamber. For example, the pumping chamber can have an oval lateral cross-section, while the drive electrode can have hexagonal shape but be large enough to cover the entire lateral cross-section of the pumping chamber. In some implementations, at least one pair of opposing edges of each drive electrode are parallel to each other, and along the same direction as an edge of the nozzle array on the substrate or to an edge of the substrate 502, such that a large number of drive electrodes (and pumping chambers) can be packed into the space over the surface of the substrate 502.

Figure 5B:
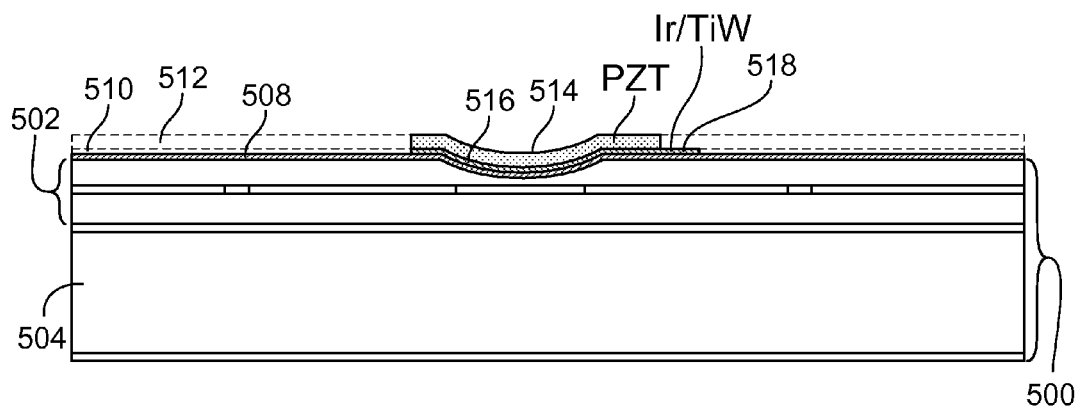

FIG. 5B shows the product formed after the piezoelectric layer 512 and the drive electrode layer 510 have been patterned to define the individual piezoelectric elements and the individual drive electrodes underneath the piezoelectric elements. At this stage, the piezoelectric element 514 and drive electrode 516 that belong to the same actuator structure have been isolated from the piezoelectric elements 514 and drive electrodes 516 that belong to other actuator structures in the actuation assembly. In addition, a respective electrical connection has been made from a respective electrical connection pad 518 to a corresponding drive electrode 516.

After the drive electrode layer 510 is patterned and the drive electrodes are defined, a first layer of insulator material can be deposited over the substrate 502. The first insulator layer 520 covers at least the exposed surface of the piezoelectric elements 514, the exposed surface of the drive electrodes, and the exposed surface of the oxide layer 508 shown in FIG. 5B. The material of the first insulator layer 520 can include, for example, silicon oxide or silicon nitride, or a combination thereof.

The first insulator layer 520 can then be patterned (e.g., etched) to expose central portions of the top surface of the piezoelectric elements 514 over the pumping chambers, and to expose the electrical connection pads 518 in the drive electrode layer 510. The patterned insulator layer 520 also covers areas on the oxide layer 510 at which the fluid seals for the fluid inlets and the fluid outlets will be formed subsequently, at which the spacer bumps will be formed subsequently, and at which the electrical connections to the reference electrodes will be formed subsequently, respectively.

After the first insulator layer 520 is patterned, a second conductive layer 522 (e.g., a layer of Au over a Ti/W interface layer) can be deposited over the substrate 502 and patterned. The patterned second conductive layer 522 covers the exposed surface of the drive electrode layer 512 at locations 522 where electrical connections will be made to the drive electrodes (e.g., over the connection pads 518 in the drive electrode layer). The newly deposited conductive materials (e.g., Au/TiW) over the connection pads 518 in the drive electrode layer will form the raised connection pads for the vertically-oriented conductive columns (or the electrical connection bumps) between the drive electrodes and the integrated circuit layer (to be subsequently attached). The raised connection pads formed by the newly deposited conductive materials are insulated from the edge of the piezoelectric elements 514 and other elements on the substrate 502 other than their respective drive electrode connection pads 518 in the drive electrode layer 510.

Figure 5C:
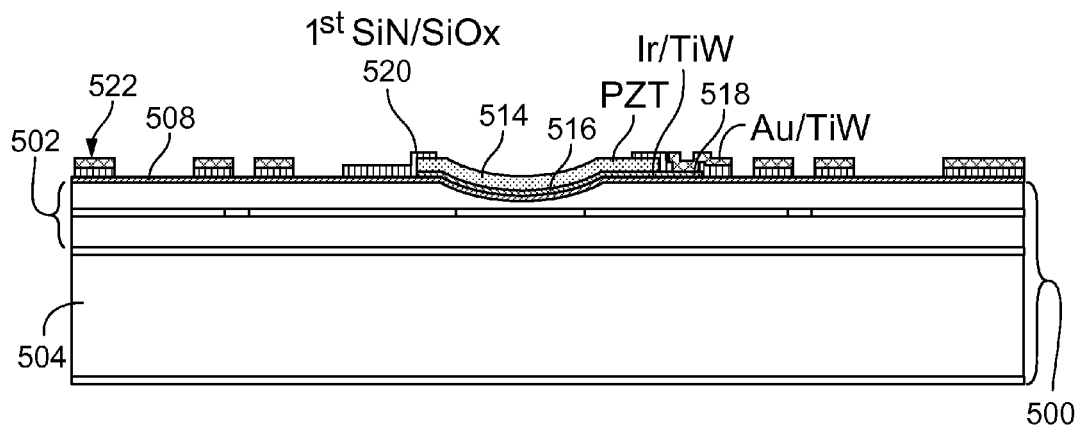

The patterned second conductive layer 522 also covers areas where the fluid seals, spacer bumps, and connections to the reference electrodes will be made. The patterned second conductive layer 522 can leave the previously exposed portions of the oxide layer 508, previously exposed portions of the first insulator layer 520, and the previously exposed portions of the piezoelectric elements 514, respectively. FIG. 5C shows the product formed after the second conductive layer 520 has been patterned.

Then, a second insulator layer 524 (e.g., SiN, SiOx, or a combination thereof) can be deposited over the substrate 502 and patterned. The patterned second insulator layer 524 covers the peripheral portions of the piezoelectric element 514, and further insulates the piezoelectric element 514 from the conductive materials deposited over the connection pads 518 to the drive electrodes 516. In addition, the patterned second insulator layer 524 also leaves exposed the central portions of the piezoelectric element 514 directly above the pumping chamber. Other portions of the patterned second insulator layer 524 cover the areas where the fluid seals, and electric connection bumps, and spacer bumps will be formed on the substrate 502, such that the height of these areas remain substantially identical after each processing step.

Figure 5D:
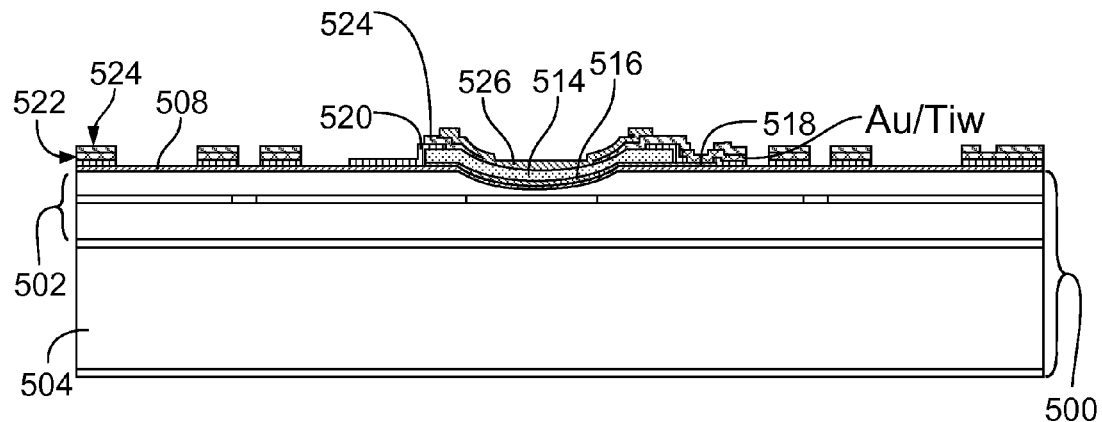

After the second insulator layer 524 is deposited and patterned, a third conductive layer 526 can be deposited over the piezoelectric elements 514, and part of the patterned insulator layer 524 near the peripheral portions of the piezoelectric elements 514. The patterned third conductive layer 526 can form an individual reference electrode on each piezoelectric element 514. The individual reference electrode can be subsequently connected by a conductive sheet deposited over the individual reference electrodes to form a continuous common reference electrode. The third conductive layer 526 can be of a different material than the first conductive layer (i.e., the drive electrode layer 510), and of a different material than the conductive sheet that would be subsequently deposited. Since the third conductive layer 526 will be used as the reference electrodes, and kept inactive (e.g., at the earth ground potential) during operation, constraints on the choice of the conductive metal for the third conductive layer 526 can be fewer and/or different from those for the first conductive layer (i.e., the drive electrode layer 510). In addition, since the third conductive layer 526 is in direct contact with the piezoelectric elements 514, the material choice for the third conductive layer 526 can take into account the compatibility with the piezoelectric material used for the piezoelectric element 514. In some implementations, the third conductive layer 526 includes a layer of sputtered Iridium. Other conductive materials (e.g., metals, metal oxides, alloys, etc.) can be used for the third conductive layer 526. FIG. 5D shows the product formed after the third conductive layer has been deposited and patterned.

After the individual reference electrodes (e.g., formed by the patterned third conductive layer 526) are defined over the piezoelectric elements 514. A metal seed layer 528 (e.g., a layer of Au/Nb) can be deposited over the entire top surface of the substrate 502, covering all of the individual reference electrodes (e.g., the Ir top electrodes) that have been formed on the piezoelectric elements 514. The seed metal layer 528 can electrically connect all the individual reference electrodes that have been formed over the piezoelectric elements 514, and forms a continuous common reference electrode that spans multiple individual drive electrodes. The seed metal layer 528 also covers the areas where the fluid seals, spacer bumps, and connection pads will be formed on the substrate 502.

After the seed metal layer 528 has been deposited, one or more conductive plating materials (e.g., one or more metals) can be plated over areas of the fluid seals, the spacer bumps, connections pads to the drive electrodes, and connection pads on the continuous common reference electrode. The plated conductive materials 530 can form at least portions of the fluid seals (e.g., 530a), spacer bumps (e.g., 530b), electrical connection bumps or columns (e.g., 530c) for the drive electrodes, and the electrical connection bumps or columns (e.g., 530d) for the common reference electrode.

Figure 5E:
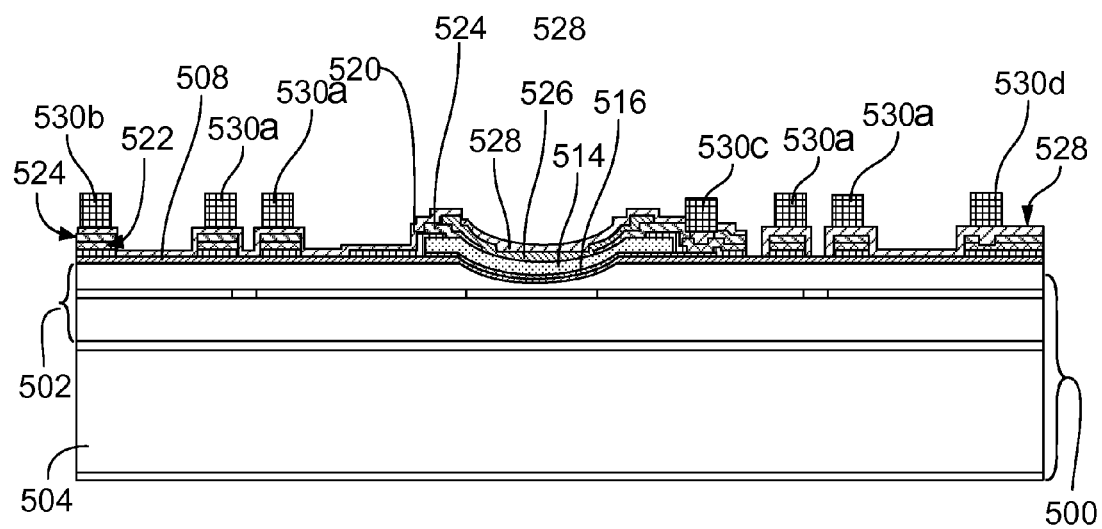

The plated conductive (e.g., Au) fluid seals can serve to prevent fluid from coming in contact with the actuation assembly as the fluid passes through the fluid channels into the substrate. The plated spacer bumps can serve to support the integrated circulate layer that is to be subsequently attached to the actuation assembly from above and create space for the actuation of the actuator structures. The plated electrical connection bumps or columns can serve as spacer bumps for the actuator assembly, and to provide the necessary electrical connections from the integrated circuit layer (to be attached) to the individual drive electrodes and the common reference electrode. FIG. 5E shows the product formed after the plating has been completed.

After the plating, the seed metal layer 528 can be patterned to isolate the drive electrodes, the reference electrode, the fluid seals, and the spacer bumps from one another. The remaining seed metal layer 528 can continue to connect multiple individual reference electrodes and form the continuous reference electrode. Apertures can be formed in the continuous reference electrode such that the plated metals for fluid seals, and the electrical connection bumps to the drive electrodes can go through the apertures to the integrated circuit layer (to be attached) while still be insulated from the continuous common reference electrode. For example, each aperture can encircle a respective fluid seal, or a respective electrical connection for a single pumping chamber. These apertures can form an array of apertures, each aperture located at a location in the seed metal layer 528 in proximity to a respective pumping chamber in the substrate. In some implementations, more of the metal seed layer can be removed (e.g., by etching), leaving just sufficient portions to form the continuous common reference electrode. For example, portions of the seed metal layer 528 can be removed from above the individual reference electrodes, such that the individual reference electrodes are electrically connected by the seed metal layer 528, but do not have excessive thickness due to the materials in the seed metal layer 528.

Figure 5F:
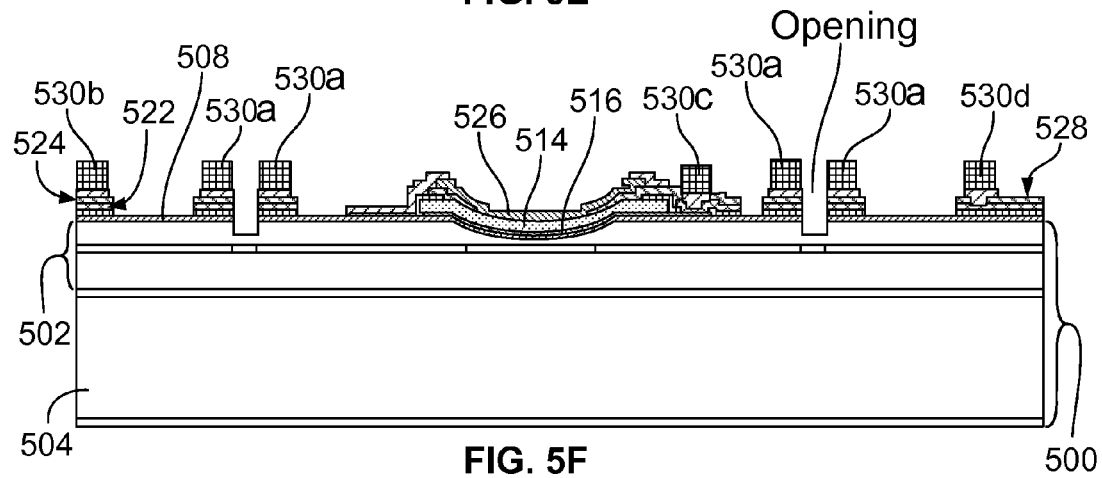

Then, portions of the oxide layer 508 that is within the central openings of the fluid seals can be removed, and the fluid inlets and fluid outlets can be opened up on the surface of the pumping chamber layer 502, for example by etching. FIG. 5F shows the product formed after the inlet and outlet openings have been formed in the surface of the pumping chamber layer 502.

Figure 5G:
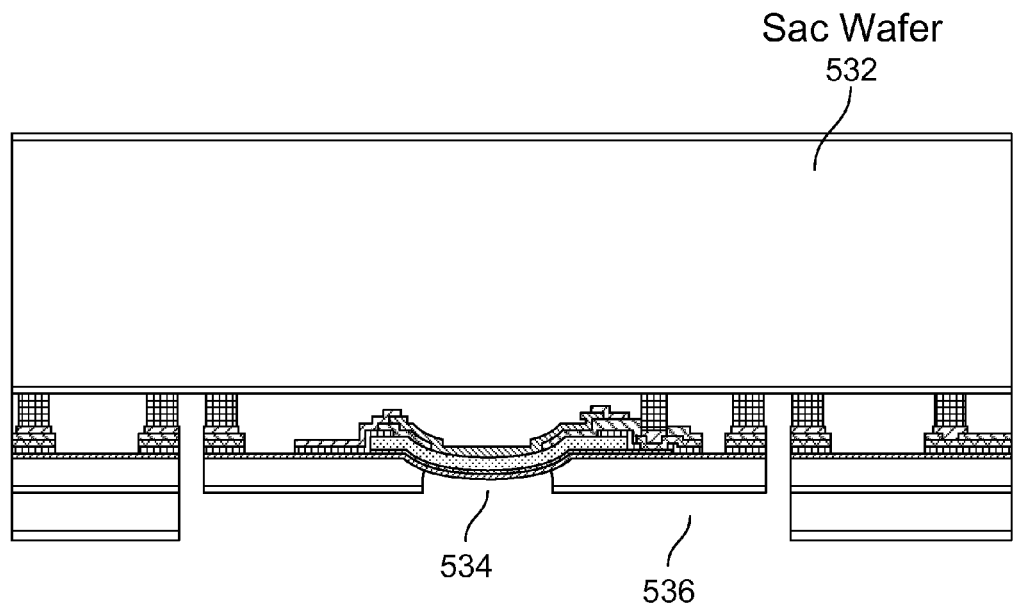
Figure 5H:
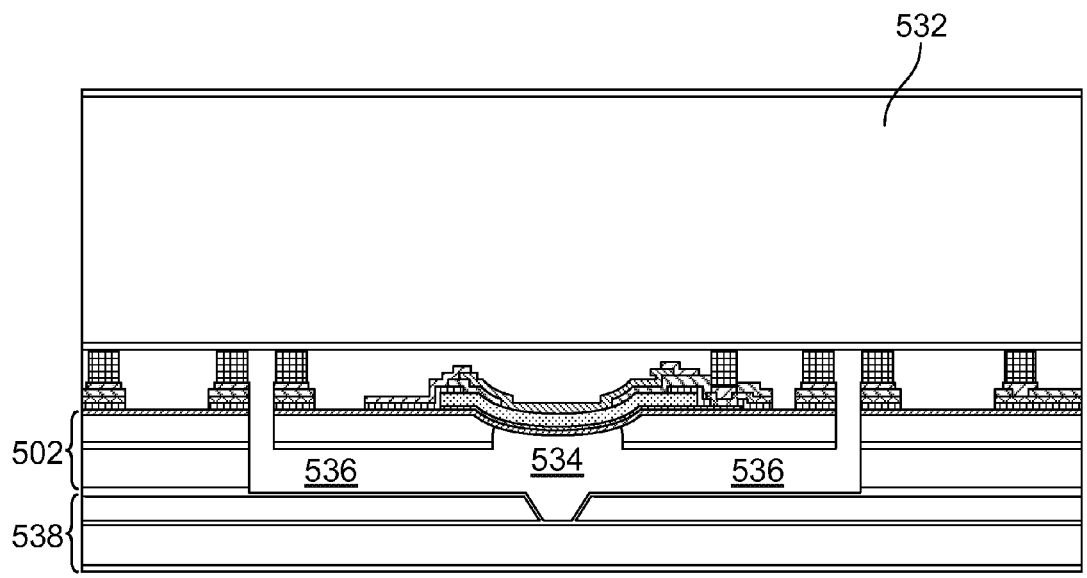
Figure 5I:
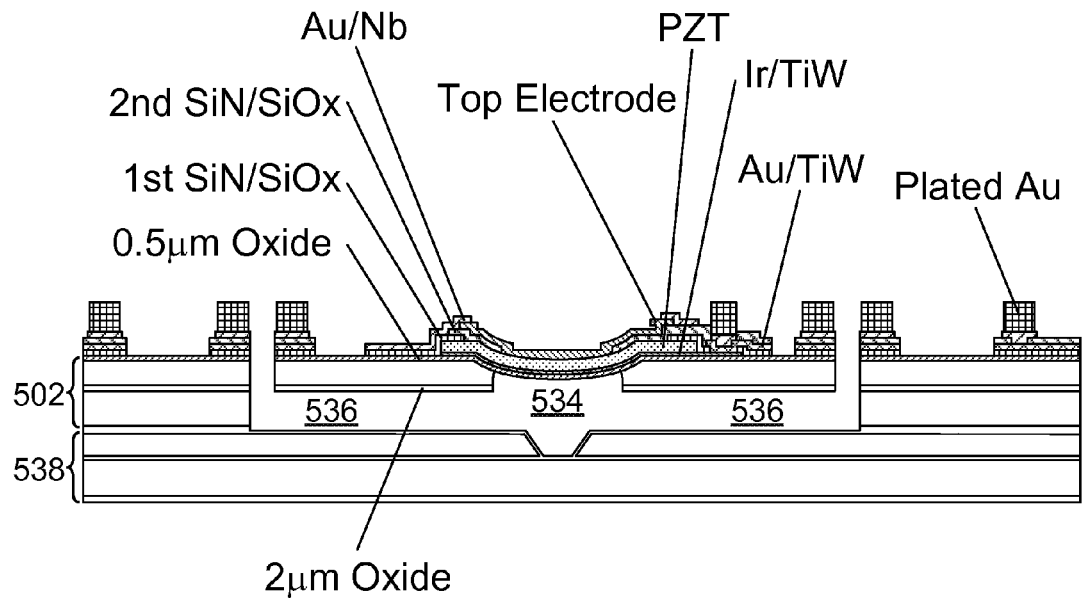

FIGS. 5G-5I shows example processing steps for forming the pumping chamber cavities and the nozzles in the substrate. These processing steps are merely illustrative, and the flow paths, including the pumping chamber cavities and the nozzles can be formed in the substrate at other times, and according to other process flows.

As shown in FIG. 5G, a sacrificial wafer 532 can be attached to the substrate 502 above the actuation assembly. The sacrificial wafer 532 can be used as a handle layer, when the handle layer 504 is removed. The pumping chamber cavities 534 and fluid passages 536 (e.g., inlet feeds and outlet feeds) can then be formed in the pumping chamber layer 502. And a nozzle layer 538 can be bonded to the pumping chamber layer 502. The nozzle layer 538 can itself be attached to a handle layer, which can be used as the handle layer for the entire structure, when the sacrificial wafer 532 is subsequently removed. FIG. 5H shows the product formed after the nozzle layer 538 and its handle layer have been bonded to the pumping chamber layer 502. Then, the sacrificial wafer 532 can be removed to re-expose the actuation assembly, such that an integrated circuit layer can be attached to the exposed side of the actuation assembly. FIG. 5I shows the product formed after the sacrificial wafer 532 have been removed and the actuation assembly has been exposed.

The integrated circuit layer can be included in a pre-formed integrated circuit wafer (e.g., an ASIC wafer 540). The ASIC wafer 540 includes active circuit elements 542 (e.g., transistors) that can provide individually controlled drive signals to the individual drive electrodes in the actuation assembly. The ASIC wafer 540 also includes an electrical ground 544 that is kept at a ground voltage that is at or below the lowest voltage that the active circuit elements will provide to the drive electrodes. In some implementations, the body of the ASIC wafer (e.g., the semiconductor body in which the integrated circuit elements (e.g., NMOS transistors) have been formed) is kept at the ground voltage, and serves as the electrical ground of the integrated circuit layer.

As set forth earlier in the specification, the integrated circuit layer includes fluid passages 546 (e.g., fluid passages vertically oriented relative to the plane of the integrated circuit layer) that go through the integrated circuit layer from one side (e.g., the top side) to the other side (e.g., the bottom side) of the integrated circuit layer (e.g., the body of the ASIC wafer 540). The openings of the fluid passages on the face of the ASIC wafer 540 facing the actuation assembly are illustrated in FIG. 4.

In addition to the openings of the fluid passages 546, the face of the ASIC wafer 540 facing the actuation assembly can also include corresponding conductive fluid seals, spacer bumps, electrical connection bumps connected to the electrical ground of the ASIC wafer, and electrical connection bumps connected to the active circuit elements in the ASIC wafer, that can be bonded respectively to the fluid seals, spacer bumps, electrical connection bumps connected to the common reference electrode of the actuation assembly, and electrical connection bumps connected to the individual drive electrodes of the actuation assembly.

In some implementations, the bonding between the ASIC wafer 540 and the actuation assembly can be accomplished through a eutectic bonding processing that join the conductive fluid seals, spacer bumps, electrical connection bumps connected to the electrical ground of the ASIC wafer, and electrical connection bumps connected to the active circuit elements in the ASIC wafer, to their respective fluid seals, spacer bumps, electrical connection bumps connected to the common reference electrode of the actuation assembly, and electrical connection bumps connected to the individual drive electrodes of the actuation assembly. The joined electrical connection bumps can form the conductive columns 548 that electrical connect the common reference electrode in the actuation assembly to the electrical ground of the integrated circuit layer, and the conductive columns 550 that electrically connect the active circuit elements in the integrated circuit layer to their respective drive electrodes in the actuation assembly.

Figure 5J:
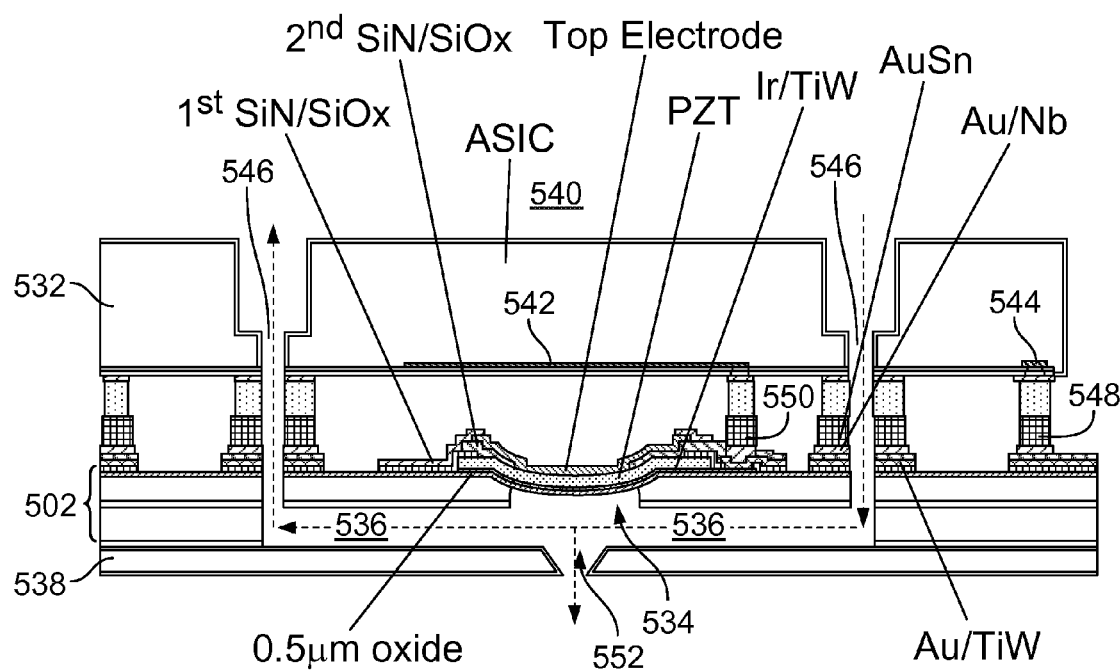

After the ASIC wafer 540 is bonded to the actuation assembly (e.g., by eutectic bonding), the ASIC wafer 540 can serve as the handle layer for subsequent processing, such as the removal of the handle layer below the nozzle layer 538 to open up the nozzles in the nozzle face. FIG. 5J shows a product formed after the nozzles 552 have been opened in the nozzle face.

The use of terminology such as "front," "back," "top," "bottom," "left," "right," "over," "above," and "below" throughout the specification and claims is for describing the relative positions of various components of the system(s) and relative positions of various parts of the various components described herein. Similarly, the use of any horizontal or vertical terms throughout the specification and claims is for describing the relative orientations of various components of the system(s) and the relative orientations of various parts of the various components described herein. Except where a relative orientation or position set forth below is explicitly stated in the description for a particular component, system, or device, the use of such terminology does not imply any particular positions or orientations of the system, device, component or part(s) thereof, relative to (1) the direction of the Earth's gravitational force, (2) the Earth ground surface or ground plane, (3) a direction that the system(s), device(s), or particular component(s) thereof may have in actual manufacturing, usage, or transportation; or (4) a surface that the system(s), device(s), or particular component(s) thereof may be disposed on during actual manufacturing, usage, or transportation.

A number of embodiments of the invention have been described. Nevertheless, it will be understood that various modifications may be made without departing from the spirit and scope of the inventions. For example, some processing steps may be carried out in a different order, modified, or omitted. The layout and configuration of the nozzles, pumping chambers, electrical connections, may be varied.

What is claimed is:

1. An apparatus for ejecting fluid droplets, comprising:
    a substrate having a plurality of flow paths formed therein, each flow path including a respective pumping chamber and a respective nozzle, and the respective nozzle being configured to eject fluid droplets through a first surface of the substrate in response to actuation of the respective pumping chamber;
    an actuation assembly including a drive electrode layer over a second surface of the substrate opposite to the first surface, a piezoelectric layer over the drive electrode layer, and a reference electrode layer over the piezoelectric layer, the drive electrode layer being patterned to define an individually controllable drive electrode over each of two or more pumping chambers in the substrate, and the reference electrode layer including a continuous reference electrode spanning the two or more pumping chambers in the substrate, wherein the continuous reference electrode includes one or more apertures; and
    an integrated circuit layer attached to the actuation assembly on a side of the actuation assembly opposite to the substrate, and each of the one or more apertures encircling a respective electrical connection between the drive electrode in the actuation assembly and the integrated circuit layer.

2. The apparatus of claim 1, further comprising circuitry electrically connected to each drive electrode and to the continuous reference electrode, the circuitry being configured such that during fluid droplet ejection, the continuous reference electrode being maintained at a reference voltage at or near an earth ground voltage, and each drive electrode being configured to actuate the piezoelectric layer using driving voltages whose minimum is at or above the reference voltage.

3. The apparatus of claim 1, wherein the integrated circuit layer includes one or more application-specific integrated circuits (ASICs) for individually controlling the drive electrodes in the actuation assembly.

4. The apparatus of claim 3, wherein the integrated circuit layer includes fluid passages for transporting fluid to the flow paths in the substrate.

5. The apparatus of claim 3, wherein the integrated circuit layer includes one or more active circuit components and an electrical ground, the one or more active circuit component being electrically connect to the drive electrodes in the actuation assembly, and the electrical ground being electrically connected to the reference electrode in the actuation assembly.

6. The apparatus of claim 5, wherein the one or more active circuit components comprise positive logic transistors having a low state at or above a voltage of the electrical ground.

7. The apparatus of claim 5, wherein the one or more active circuit components comprise NMOS or NDMOS transistors.

8. The apparatus of claim 5, wherein the electrical ground in the integrated circuit layer is maintained at a reference voltage at or near an earth ground voltage, and the one or more active circuit components have minimum output voltages at or above the reference voltage.

9. The apparatus of claim 1, wherein the piezoelectric layer is poled in a direction pointing from the drive electrode layer to the reference electrode layer.

10. The apparatus of claim 1, wherein the piezoelectric layer comprises a layer of Lead Zirconate Titanate (PZT).

11. The apparatus of claim 1, wherein the piezoelectric layer comprises a layer of sputtered Lead Zirconate Titanate (PZT).

12. The apparatus of claim 1, wherein the substrate has a nozzle density sufficient to generate a resolution of at least 100 dpi.

13. The apparatus of claim 1, wherein the pumping chambers in the substrate form a parallelogram-shaped array, and each drive electrode has at least one pair of edges along a direction substantially parallel to an edge of the parallelogram-shaped array and spans a cross-section of a single pumping chamber in the substrate.

14. The apparatus of claim 1, wherein the drive electrode layer is made of a first conductor and the reference electrode is made of a second, different conductor.

15. The apparatus of claim 14, wherein at least one of the drive electrode layer or the reference electrode layer has a thickness of 1000 to 3000 Angstroms.

16. The apparatus of claim 1, wherein the piezoelectric layer is patterned to define an individual piezoelectric element within an area over each drive electrode in the drive electrode layer.

17. The apparatus of claim 1, wherein the respective electrical connection between the drive electrode and the integrated circuit layer is a vertically-oriented conductive column going through the aperture, and wherein the vertically-oriented conductive column is electrically connected to the drive electrode and is electrically insulated from the reference electrode.

18. The apparatus of claim 1, further comprising:
    one or more vertically-oriented conductive columns between the integrated circuit layer and the continuous reference electrode layer.

19. The apparatus of claim 18, wherein at least some of the one or more conductive columns electrically connect the reference electrode and the integrated circuit layer.

20. The apparatus of claim 18, wherein at least some of the one or more conductive columns are electrically connected to a voltage ground in the integrated circuit layer.

21. The apparatus of claim 1, wherein the piezoelectric layer is a sputtered piezoelectric layer having an as-deposited poling direction pointing from the drive electrode layer to the reference electrode layer.

22. The apparatus of claim 8, wherein the piezoelectric layer is a sputtered piezoelectric layer having an as-deposited poling direction pointing from the drive electrode layer to the reference electrode layer.

23. The apparatus of claim 22, wherein a driving voltage applied to the drive electrode is positive.

24. The apparatus of claim 1, further comprising:
circuitry electrically connected to each drive electrode and to the continuous reference electrode,
wherein the integrated circuit layer includes one or more application-specific integrated circuits (ASICs) for individually controlling the drive electrodes in the actuation assembly, the circuitry is configured such that during fluid droplet ejection, the continuous reference electrode being maintained at a reference voltage at or near an earth ground voltage, and each drive electrode being configured to actuate the piezoelectric layer using driving voltages whose minimum is at or above the reference voltage, and the integrated circuit layer includes fluid passages for transporting fluid to the flow paths in the substrate.

* * * * *